(12) United States Patent
Maurino

(10) Patent No.: US 10,312,926 B2
(45) Date of Patent: Jun. 4, 2019

(54) NOISE-SHAPING ANALOG-TO-DIGITAL CONVERTER

(71) Applicant: Analog Devices Global Unlimited Company, Hamilton (BM)

(72) Inventor: Roberto Sergio Matteo Maurino, Turin (IT)

(73) Assignee: Analog Devices Global Unlimited Company, Hamilton (BM)

( * ) Notice: Subject to any disclaimer, the term of this patent is extended or adjusted under 35 U.S.C. 154(b) by 0 days.

(21) Appl. No.: 16/013,425

(22) Filed: Jun. 20, 2018

(65) Prior Publication Data

US 2019/0131989 A1 May 2, 2019

Related U.S. Application Data

(60) Provisional application No. 62/578,635, filed on Oct. 30, 2017.

(51) Int. Cl.
| | |
|---|---|
| H03M 1/06 | (2006.01) |
| H03M 1/08 | (2006.01) |
| H03M 1/12 | (2006.01) |
| H03M 1/00 | (2006.01) |
| H03M 3/00 | (2006.01) |
| H03M 1/10 | (2006.01) |

(52) U.S. Cl.
CPC ............ H03M 1/08 (2013.01); *H03M 1/00* (2013.01); *H03M 1/06* (2013.01); *H03M 1/1023* (2013.01); *H03M 1/12* (2013.01); *H03M 3/30* (2013.01)

(58) Field of Classification Search
CPC ........ H03M 1/06; H03M 1/1023; H03M 1/12; H03M 1/00; H03M 3/30

USPC .................. 341/118, 120, 143, 155, 161
See application file for complete search history.

(56) References Cited

U.S. PATENT DOCUMENTS

| | | | |
|---|---|---|---|
| 8,810,443 B2 | 8/2014 | Steensgaard-Madsen | |
| 9,054,727 B2 | 6/2015 | Steensgaard-Madsen | |
| 9,231,611 B2 | 1/2016 | Steensgaard-Madsen | |
| 9,425,818 B1 | 8/2016 | Rajaee et al. | |
| 2005/0093726 A1* | 5/2005 | Hezar | H03M 3/412 341/143 |
| 2014/0266827 A1 | 9/2014 | Ceballos | |

(Continued)

OTHER PUBLICATIONS

Fredenburg, J.A., "Noise-shaping SAR ADCs", Dissertation for Doctor of Philosophy (Electrical Engineering) in the University of Michigan, (2015), 157 pgs.

(Continued)

*Primary Examiner* — Joseph J Lauture
(74) *Attorney, Agent, or Firm* — Schwegman Lundberg & Woessner, P.A.

(57) ABSTRACT

Shortening any of the operational phases of a noise-shaping successive approximation register (SAR) analog-to-digital converter (ADC), including the acquisition phase, the bit trial phase, and the residue charge transfer phase, can result in higher power, and it can be difficult to achieve high speed at low power. Using various techniques described, the acquisition, bit-trial, and residue charge transfer phases of two or more digital-to-analog converter (DAC) circuits of an ADC circuit can be time-interleaved. The use of two or more DAC circuits can increase or maximize the time available for the acquisition, bit-trial, and residue charge transfer phases.

20 Claims, 9 Drawing Sheets

(56) References Cited

U.S. PATENT DOCUMENTS

2017/0085349 A1  3/2017  Ho et al.
2017/0126239 A1  5/2017  Sun et al.
2018/0183450 A1  6/2018  Liu

OTHER PUBLICATIONS

Brewer, R., et al., "A 100dB SNR 2.5MSs Output Data Rate Delta Sigma ADC", IEEE International Solid-State Circuits Conference, Session 9, (Feb. 8, 2005), 3 pgs.

* cited by examiner

US 10,312,926 B2

NOISE-SHAPING ANALOG-TO-DIGITAL CONVERTER

CLAIM OF PRIORITY

This application claims the benefit of priority of U.S. Provisional Patent Application Ser. No. 62/578,635, titled "NOISE-SHAPING ANALOG-TO-DIGITAL CONVERTER" to Roberto Sergio Matteo Maurino et al., filed on Oct. 30, 2017, the entire contents of which being incorporated herein by reference.

FIELD OF THE DISCLOSURE

This document pertains generally, but not by way of limitation, to integrated circuits, and more particularly, to analog to digital converter circuits and systems.

BACKGROUND

In many electronics applications, an analog input signal is converted to a digital output signal (e.g., for further digital signal processing). For instance, in precision measurement systems, electronics are provided with one or more sensors to make measurements, and these sensors can generate an analog signal. The analog signal can then be provided to an analog-to-digital converter (ADC) as input to generate a digital output signal for further processing. In another instance, in a mobile device receiver, an antenna can generate an analog signal based on the electromagnetic waves carrying information/signals in the air. The analog signal generated by the antenna can then be provided as input to an ADC to generate a digital output signal for further processing.

A difference between the input voltage and the output voltage of the ADC can correspond to the quantization error of the ADC. In some ADCs, the quantization error can be further processed by ADC circuitry to "shape" the quantization error, which appears as quantization noise in the frequency domain. Noise shaping techniques can push the quantization noise away from the signal band of interest and into higher frequencies, for example.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

SUMMARY OF THE DISCLOSURE

Figure 1:
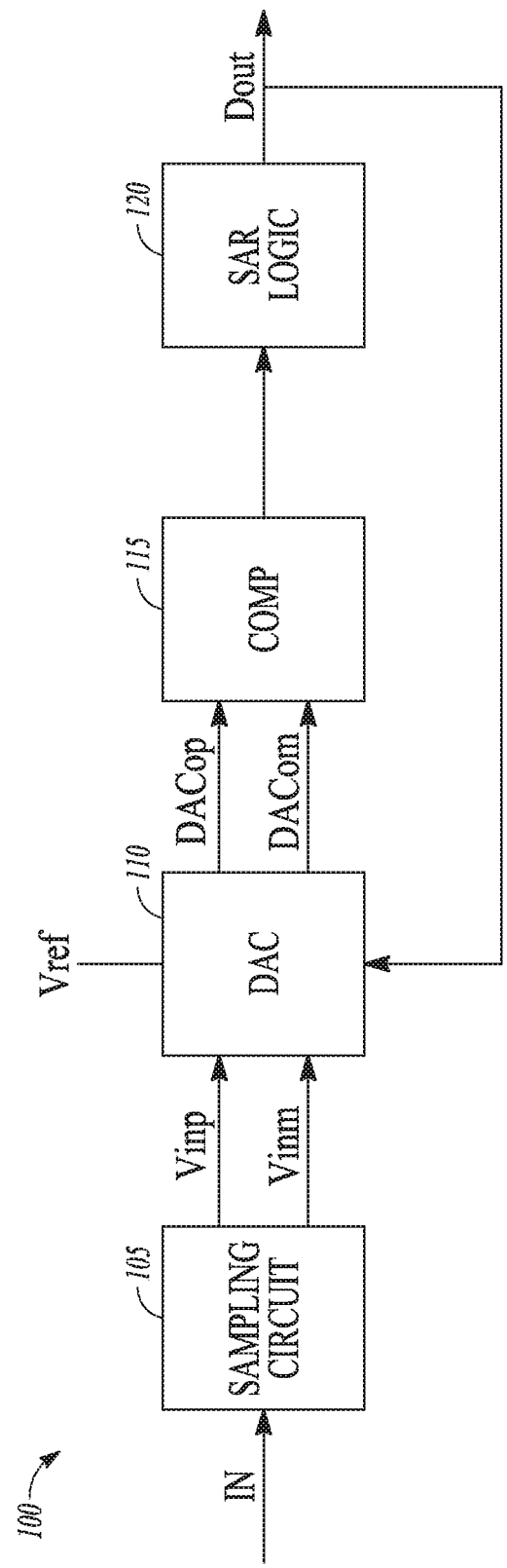
FIG. 1 is a functional block diagram of an example of a successive approximation register (SAR) analog-to-digital converter (ADC) circuit.

Shortening any of the operational phases of a noise-shaping successive approximation register (SAR) analog-to-digital converter (ADC), including the acquisition phase, the bit trial phase, and the residue charge transfer phase, can result in higher power, and it can be difficult to achieve high speed at low power. Using various techniques of this disclosure, the acquisition, bit-trial, and residue charge transfer phases of two or more digital-to-analog converter (DAC) circuits of an ADC circuit can be time-interleaved. The use of two or more DAC circuits can increase or maximize the time available for the acquisition, bit-trial, and residue charge transfer phases.

In some aspects, this disclosure is directed to a method of operating a noise-shaping successive approximation register analog-to-digital converter (ADC) circuit including time-interleaved signal acquisition with a shared noise-shaping circuit. The method comprises receiving, using a first digital-to-analog converter (DAC) circuit, a first sample of an input signal during an acquisition phase of the first DAC circuit; receiving, using a second DAC circuit, a second sample of the input signal during an acquisition phase of the second DAC circuit that occurs after the acquisition phase of the first DAC circuit; and controlling a timing between the first and second DAC circuits and the noise-shaping circuit to time-interleave acquisition, bit-trial, and residue charge transfer phases of the first and second DAC circuits.

In some aspects, this disclosure is directed to a noise-shaping successive approximation register (SAR) analog-to-digital converter (ADC) circuit including time-interleaved signal acquisition with a shared noise-shaping circuit. The ADC circuit comprises a first digital-to-analog converter (DAC) circuit; a second DAC circuit; and a control circuit configured to control a timing between the first and second DAC circuits and the noise-shaping circuit to time-interleave acquisition, bit-trial, and residue charge transfer phases of the first and second DAC circuits.

In some aspects, this disclosure is directed to a noise-shaping successive approximation register (SAR) analog-to-digital converter (ADC) circuit including time-interleaved signal acquisition with a shared noise-shaping circuit. The ADC circuit comprises means for receiving a first sample of an input signal during an acquisition phase of a first digital-to-analog converter (DAC) circuit; means for receiving a second sample of the input signal during an acquisition phase of a second DAC circuit that occurs after the acquisition phase of the first DAC circuit; and means for controlling a timing between the first and second DAC circuits and the noise-shaping circuit to time-interleave acquisition, bit-trial, and residue charge transfer phases of the first and second DAC circuits.

DETAILED DESCRIPTION

During an acquisition phase of an analog-to-digital converter (ADC) circuit, a digital-to-analog converter (DAC) is connected to an input signal. A shorter acquisition phase typically requires a faster and higher power driver and, as such, can be undesirable.

During a bit trial phase, the SAR ADC converts the input sampled in the previous phase, going through all the bit trials. A short bit trial phase can be undesirable, as it implies faster DAC settling and a faster comparator circuit, resulting again in higher power consumption.

During a residue charge transfer phase, the quantization error stored on the DAC circuit is transferred (or "dumped") to a noise-shaping circuit. A short residue charge transfer phase can also be undesirable, as it can reduce the settling time available to transfer the residue charge and the noise-shaping circuit power increases as a result. Hence, shortening any of the operational phases of a noise-shaping SAR ADC can result in higher power, and it can be difficult to achieve high speed at low power.

Using various techniques of this disclosure, the acquisition, bit-trial, and residue charge transfer phases of two or more digital-to-analog converter (DAC) circuits of an ADC circuit can be time-interleaved. The use of two or more DAC circuits can increase or maximize the time available for the acquisition, bit-trial, and residue charge transfer phases.

A successive approximation register (SAR) analog-to-digital converter (ADC) circuit can carry out bit trials to compare portions of an analog signal to a reference voltage to determine the digital bit values of a digital word representing a particular sample of the analog signal. A SAR ADC can use a capacitor array of a digital-to-analog converter (DAC) circuit for carrying out the bit trials for determining the respective digital bit values of the digital word.

Noise-shaping SAR ADCs can combine the low power of SAR converters with the precision of oversampling sigma delta ADCs. In a capacitive SAR ADC approach, at the end of a conversion phase, the voltage stored at the output of the capacitive DAC output can include the difference between the input voltage and the output of the converter, often referred to as the "residue". The residue can correspond to the quantization error of the ADC. In a noise shaped SAR, the residue can be further processed by noise-shaping circuit, e.g., a loop filter, that shapes the quantization error of the converter and pushes its energy away from the signal band of interest.

FIG. 1 is a functional block diagram of an example of a SAR ADC successive approximation register analog-to-digital converter circuit. In the example, a differential analog input voltage is sampled and held using sampling circuit 105, and a differential output voltage of a DAC circuit 110 is compared to the sampled and held voltage using comparator circuit 115. The bit values of the DAC circuit 110 are adjusted based on the output of the comparator circuit. The conversion can start with the DAC set to midscale. The comparator 115 determines whether the DAC output is greater or less than the sampled input voltage and the result is stored as a one or zero for that bit of the DAC. Conversion then proceeds to the next bit value until all bits of the digital value are determined. One iteration of changing the DAC output and comparing the voltage to the sampled input can be referred to as a bit trial. SAR logic circuitry 120 controls the ADC operation during the bit trials. When the bit trials are complete, the digital value of the sampled and held voltage is available at output Dout.

Figure 2:
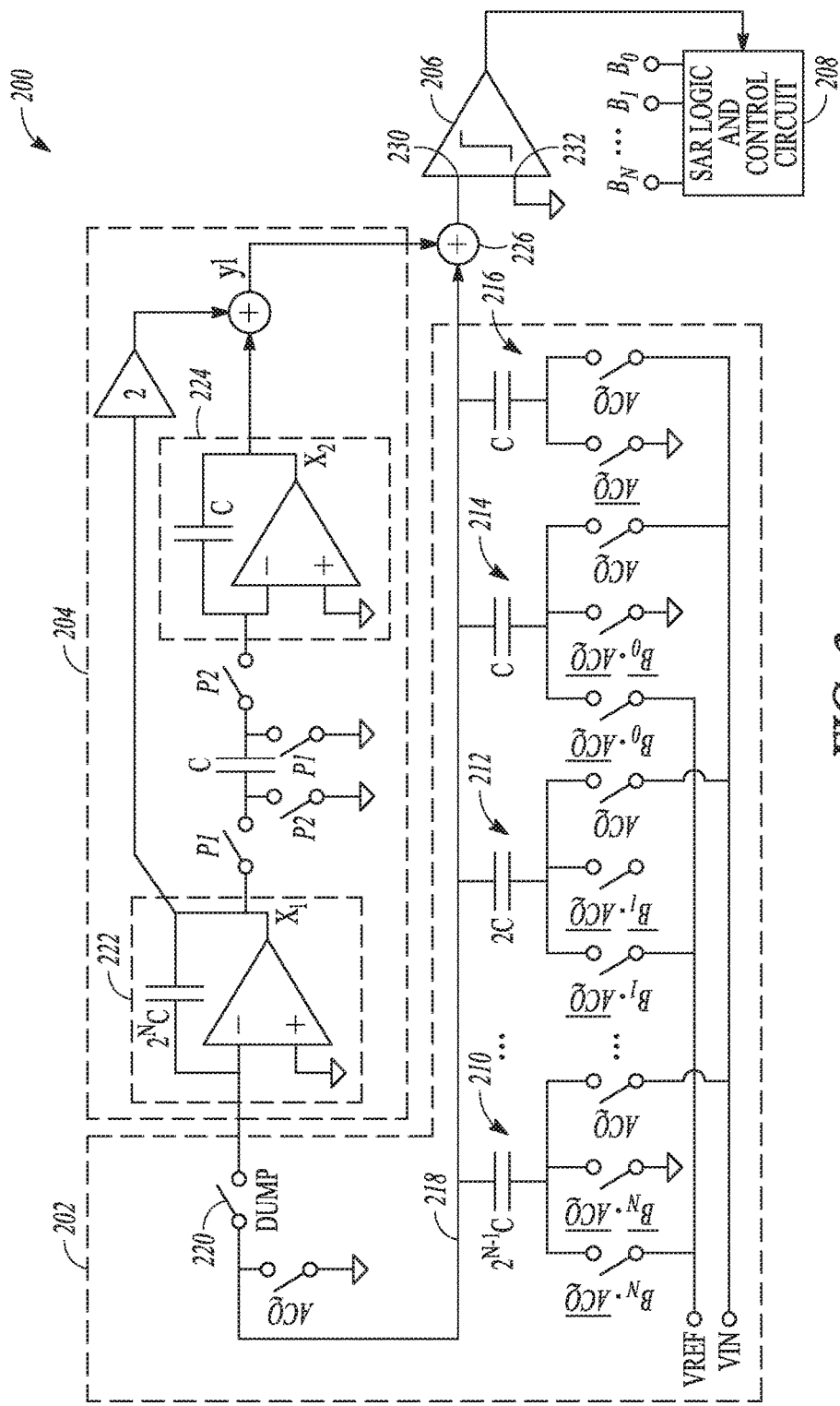
FIG. 2 illustrates an example of a noise-shaped successive approximation register analog-to-digital converter circuit.

FIG. 2 illustrates an example of a noise-shaping SAR ADC circuit. The noise-shaping SAR ADC circuit 200 can include a DAC circuit 202, e.g., a capacitor DAC circuit, a noise-shaping circuit 204, e.g., a filter circuit, a comparator circuit 206, and a control circuit 208, e.g., a SAR logic circuit, coupled between the output of the comparator circuit 206 and the DAC circuit 202. Noise-shaped SAR ADCs can be considered similar to multi-bit sigma delta ADCs where the quantizer has been replaced by a SAR ADC.

As seen in FIG. 2, the DAC circuit 202 can include a number of weighted bit-trial capacitors, e.g., binary weighted capacitors $2^{N-1}C \ldots C$, and switches, e.g., transistors, shown generally at 210-216, to couple the bit-trial capacitors to a positive reference voltage VREF, an input voltage VIN, or ground or negative reference voltage. At the end of a bit-trial phase, the residue (or "residue charge") is present at node 218 of the DAC circuit 202.

When the control circuit 208 closes the "dump" switch 220, the residue charge at node 218 is transferred to the noise-shaping circuit 204, e.g., a filter circuit. The noise-shaping circuit 204 can be a first order circuit or a higher order circuit. The noise-shaping circuit 204 of FIG. 2 is depicted as a second order circuit having a first integrator circuit 222 having output "x1" and a second integrator circuit 224 having output "x2". The control circuit 208 can output control signals to control switches "p1" and "p2" to control the sampling and integrating phases of the noise-shaping circuit 204, and the noise-shaping circuit 204 can output a voltage "y1".

Shown conceptual by a summing circuit 226, the output "y1" of the noise-shaping circuit 204 can be combined with a charge contribution at node 218 of a bit-trial of the bit-trial phase of the DAC circuit 202. The comparator circuit 206 can receive the combination at a first input 230 and can compare the combination at the first input to a voltage at a second input 232. Noise-shaping is well-known and, for purposes of conciseness, will not be described in detail.

Figure 3:
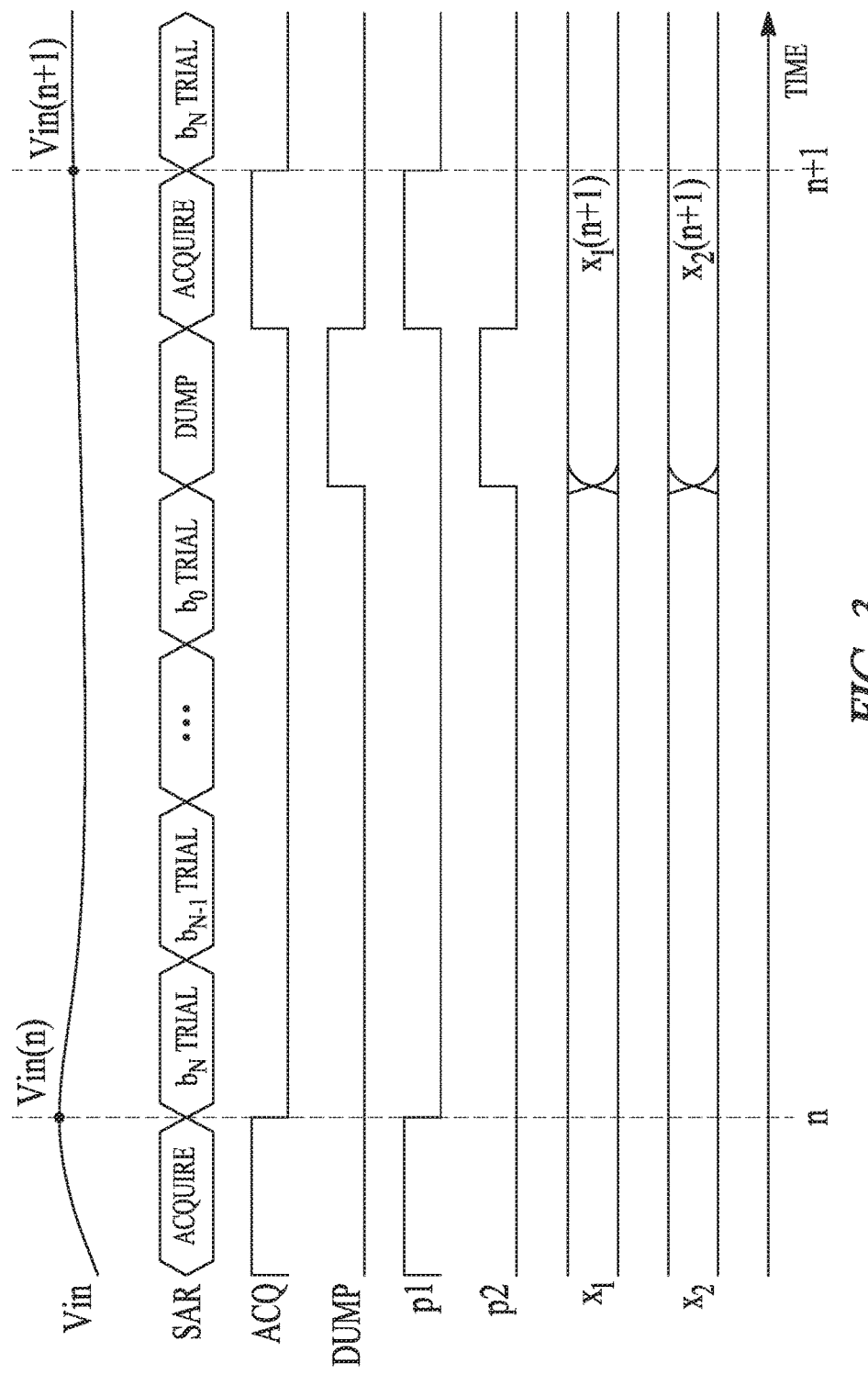
FIG. 3 depicts an example of a timing diagram for the noise-shaping SAR ADC of FIG. 2.

FIG. 3 depicts an example of a timing diagram for the noise-shaping SAR ADC of FIG. 2. Signals "x1" and "x2" represent the output the first and second integrator circuits 222, 224, respectively. Signals "p1" and "p2" control the switches p1, p2 in FIG. 2. The operation of a conventional noise shaped SAR can be divided in three phases: acquisition phase, bit trial phase, and residue charge transfer (or "dump") phase.

During the acquisition phase, the DAC circuit 202 is connected to the input signal VIN. A short acquisition phase can be undesirable, as the driver circuitry (not depicted) in front of the SAR ADC needs to settle the input to the desired accuracy during the acquisition phase. Hence, a shorter acquisition phase typically requires a faster and higher power driver.

During the bit trial phase, the SAR ADC converts the input sampled in the previous phase, going through all the bit trials. A short bit trial phase can be undesirable, as it implies faster DAC settling and a faster comparator circuit, resulting again in higher power consumption.

Finally, during the residue charge transfer phase, the quantization error stored on the DAC circuit is transferred (or "dumped") to the noise-shaping circuit. A short residue charge transfer phase can be undesirable too, as it can reduce the settling time available to transfer the residue charge and the noise-shaping circuit power increases as a result.

Hence, shortening any of the operational phases of a noise-shaping SAR ADC can result in higher power, and it can be difficult to achieve high speed at low power. The present inventor has recognized that by including two or more DAC circuits and time-interleaving their operations can overcome the limitations of the ADC of FIG. 2. The use of two or more DAC circuits can increase or maximize the time available for the acquisition, bit-trial, and residue charge transfer phases.

Figure 4:
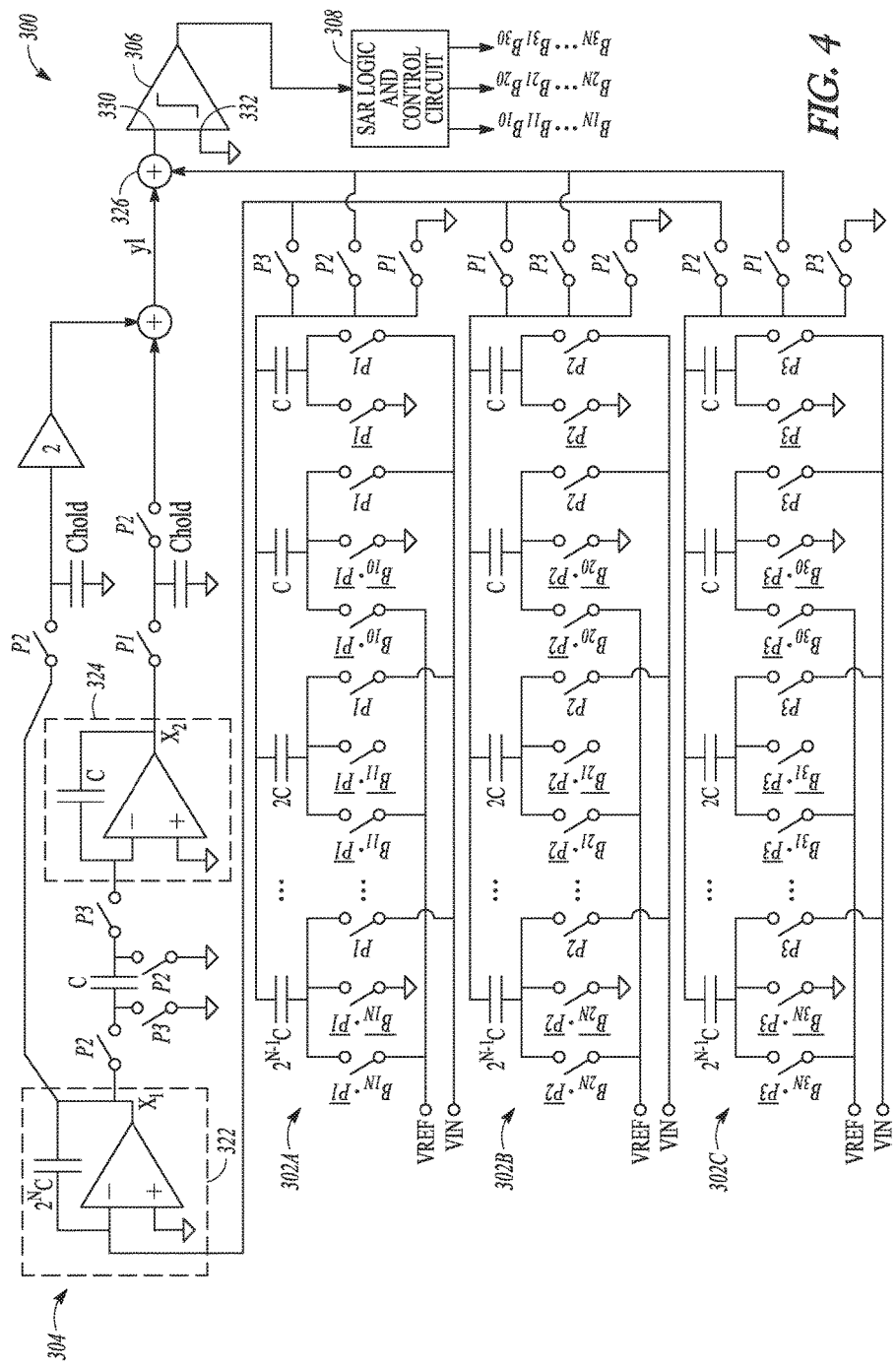
FIG. 4 illustrates an example of a noise-shaping ADC circuit including time-interleaved signal acquisition with a shared noise-shaping circuit, in accordance with this disclosure.

FIG. 4 illustrates an example of a noise-shaping ADC circuit 300 including time-interleaved signal acquisition with a shared noise-shaping circuit, in accordance with this disclosure. The noise-shaping SAR ADC circuit 300 can include a first DAC circuit 302A, a second DAC circuit 302B, and a third DAC circuit 302C (referred collectively as "DAC circuit 302". The DAC circuits 302 can include capacitor DAC circuits, for example. Each of the DAC circuits 302A-302C can be similar to the DAC circuit 202 of FIG. 2 and, for purposes of conciseness, will not be described in detail again.

Like the ADC circuit 200 of FIG. 2, the ADC circuit 300 of FIG. 4 can include a noise-shaping circuit 304, e.g., a filter circuit, a comparator circuit 306, and a control circuit 308, e.g., a SAR logic circuit, coupled between the output of the comparator circuit 306 and the DAC circuits 302. As seen in FIG. 4, the noise-shaping circuit 304 is shared by the three DAC circuits 302 and is configured to receive a residue charge of the first DAC circuit 302A, a residue charge of the second DAC circuit 302B, and a residue charge of the second DAC circuit 302C.

The noise-shaping circuit 304 can be a first order circuit or a higher order circuit. The noise-shaping circuit 304 of FIG. 4 is depicted as a second order circuit having a first integrator circuit 322 having output "x1" and a second integrator circuit 324 having output "x2". In some noise-shaping circuit configurations, a finite impulse response (FIR) circuit can be used instead of an integrator circuit. To control the sampling and integration of the three DAC circuits 302 during three phases, the control circuit 308 can output control signals P1, P2, P3 to control the various associated switches shown in FIG. 4, and the noise-shaping circuit 304 can output a voltage "y1".

Shown conceptual by a summing circuit 326, the output "y1" of the noise-shaping circuit 304 can be combined with a charge contribution of a bit-trial of the bit-trial phases of the DAC circuits 302. The comparator circuit 306 can receive the combination at a first input 330 and can compare the combination at the first input to a voltage at a second input 332. Noise-shaping is well-known and, for purposes of conciseness, will not be described in detail.

As seen in FIG. 4, each of the DAC circuits 302A-302C can be coupled via a corresponding set of switches P1, P2, P3 to ground, the summing circuit 326, and the noise-shaping circuit 304, respectively. The control circuit 308 can control operation of the switches P1, P2, P3 to control the time-interleaving operation of the DAC circuits 302.

Figure 5:
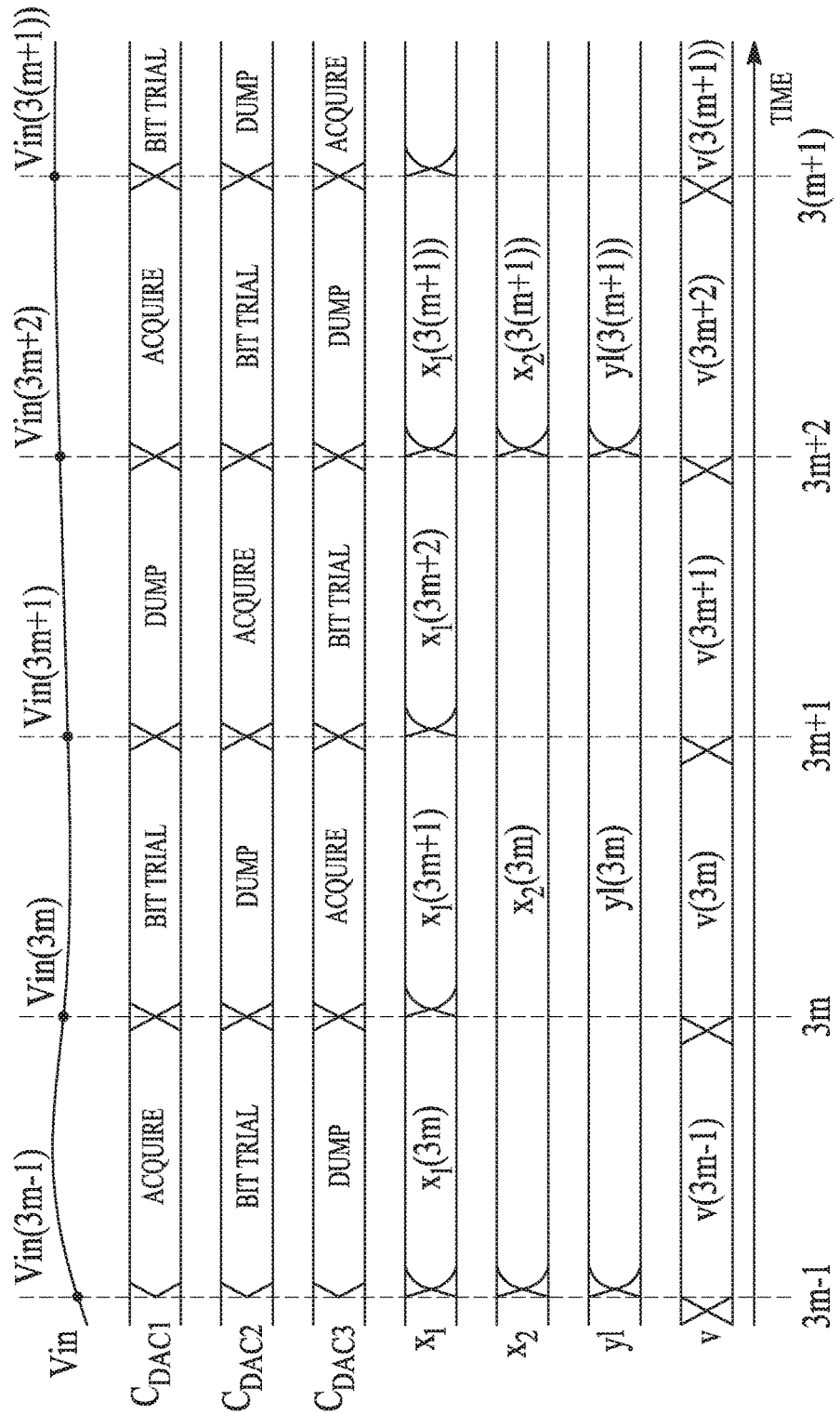
FIG. 5 depicts an example of a timing diagram for the noise-shaping SAR ADC of FIG. 4.

FIG. 5 depicts an example of a timing diagram for the noise-shaping SAR ADC of FIG. 4. The x-axis represents time, from 3m−1 to 3(m+1). The time axis is normalized to the clock period Ts. Signals "x1" and "x2" represent the output the first and second integrator circuits 322, 324 of FIG. 4, respectively, signal "y1" represents the output of the noise-shaping circuit 304, and signal "v" represents the reconstructed output $B_n \ldots B_0$ of the ADC circuit 300 corresponding to latest conversion result from the SAR register 308. The term "$C_{DAC1}$" represents the DAC circuit 302A, the term "$C_{DAC2}$" represents the DAC circuit 302B, and "$C_{DAC3}$" represents the DAC circuit 302C.

Initially, at time 3m−1, during the phase starting just after time 3m−1 and ending at time 3m, $C_{DAC1}$ is in an acquisition phase to receive a first sample of input signal Vin, $C_{DAC2}$ is in a bit-trial phase and $C_{DAC3}$ is in a residue charge transfer phase (transferring quantization error to the noise-shaping circuit 304). Then, in the next phase, starting right after time 3m and ending at 3m+1, $C_{DAC1}$ moves into a bit-trial phase, $C_{DAC2}$ is coupled to the noise-shaping circuit 304, and $C_{DAC3}$ is in an acquisition phase to receive a second sample of input signal Vin. Finally, during the following phase, $C_{DAC1}$ couples to the noise-shaping circuit 304, $C_{DAC2}$ is in an acquisition phase to receive a third sample of input signal Vin, and $C_{DAC3}$ is in a bit-trial phase. Then the entire sequence is repeated. In this manner, the control circuit 308 can time-interleave acquisition, bit-trial, and residue charge transfer phases of the first, second, and third DAC circuits.

The use of the multiple, separate DAC circuits can maximize the time available for the three phases, which can result in lower power consumption.

Assuming that a full clock period Ts is allocated to each phase, then the entire ADC circuit can now be run at a clock speed of Ts by using the three time-interleaved DAC circuits.

As the input is processed by physically different DAC circuits, their gain and offset mismatch can result in spurious frequency tones. Many calibration techniques have been introduced to address this issue and correct for DC gain and offsets. However, gain mismatch can also be frequency dependent, as the sampling bandwidth of the DAC circuits can depend on the matching of the capacitors and the sampling switches. Accurate calibration of frequency dependent gain mismatch can be challenging issue.

The present inventor has recognized an approach to mitigate any mismatch artefacts that can result from the interleaving techniques of this disclosure. In particular, the control circuit can control the operation of the switches to feed the noise-shaping circuit 304 with a combination of the residues of all of the DAC circuits. The noise-shaping circuit 304 can process the combination of the residues together and generate an output "y1" using the combination of residue charge.

In a standard second order noise-shaped SAR ADC, the converter output "v" is given by Equation 1:

$$V(z)=U(z)+Q(z)*(1-z^{-1})^2 \quad \text{(Equation 1)}$$

where U(z)=Vin(z) is the z transform of the samples of the input Vin(n) and Q(z) is the z transform of the quantization noise.

In the alternative approach proposed in this disclosure, the input signal can be replaced by Equation 2:

$$u(m)=Vin(3m)+Vin(3m-1)+Vin(3m-2) \quad \text{(Equation 2)}$$

where Vin(3m), Vin(3m−1) and Vin(3m−2) are the samples of the input Vin contributed by, respectively, $C_{DAC1}$, $C_{DAC2}$ and $C_{DAC3}$.

For a three DAC circuit configuration as in FIG. 4, it can be seen that the input signal u(m) can be obtained by downsampling by 3× the output of an FIR filter processing input signal Vin. Any gain mismatches amongst the DAC circuits can modify the frequency response of the FIR filter but do not introduce spurious tones.

As an example, assume that $C_{DAC1}$ and $C_{DAC2}$ match perfectly whereas $C_{DAC3}$ has a gain error of 1%. Then, the input signal u(m) of the noise-shaped ADC of FIG. 4 is shown by Equation 3:

$$u(m)=Vin(3m)+Vin(3m-1)+1.01*Vin(3m-2) \quad \text{(Equation 3)}$$

This simply results in a small gain error at low frequency and a slightly different frequency response at high frequency.

As seen in the timing diagram of FIG. 5, all the contribution of the $C_{DAC1}$, $C_{DAC2}$ and $C_{DAC3}$ are dumped into the first integrator (as seen by $x_1(3m)$, $x_1(3m+1)$, and $x_1(3m+2)$), before the rest of the noise-shaping circuit is updated (as seen by $x_2(3m)$ and y1(3m)). Since the noise-shaping circuit is now updated at 3× lower rate, the noise shaping of the quantization noise can be less effective. However, this can be compensated by increasing the order of the noise-shaping circuit, e.g., the loop filter circuit, or by using a cascaded approach multi-stage noise shaper circuit (MASH), or by increasing the resolution of the DAC circuits.

Notice also that during the bit trials of $C_{DAC1}$ (DAC circuit 302A of FIG. 4), the noise-shaping circuit 304 can still be settling and any settling error could affect the bit decisions. As the noise-shaping circuit contribution is small, the likelihood of such an error is rather low. Also, redundancy can be added in the DAC circuit to recover from such an error.

Figure 6:
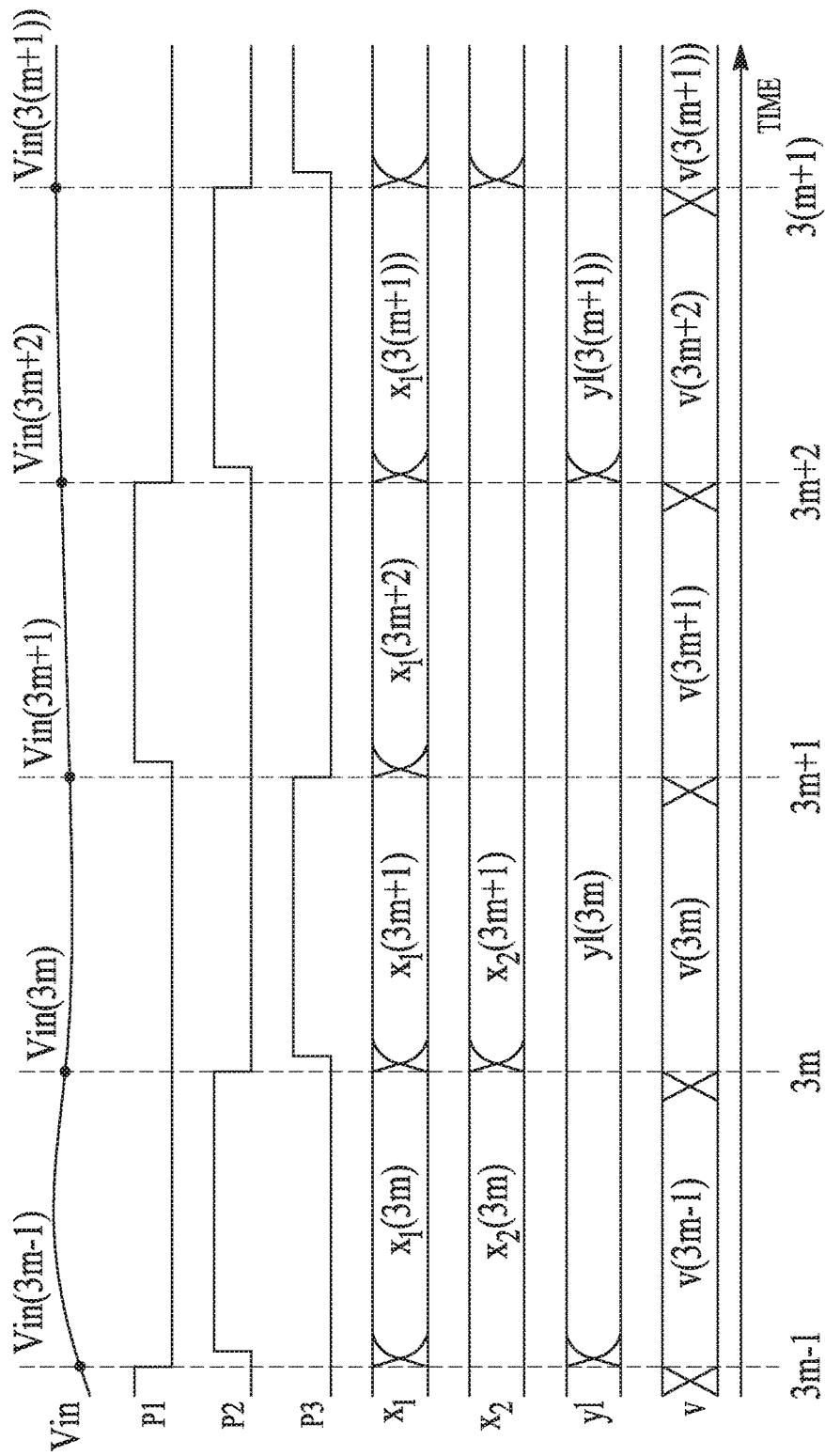
FIG. 6 depicts another example of a timing diagram for the noise-shaping SAR ADC of FIG. 4.

FIG. 6 depicts another example of a timing diagram for the noise-shaping SAR ADC of FIG. 4. The x-axis represents time, from 3m−1 to 3(m+1), normalized to the clock period Ts. Signals "x1" and "x2" represent the output the first and second integrator circuits 322, 324, respectively, signal "y1" represents the output of the noise-shaping circuit 304, and signal "v" represents the reconstructed output $B_n \ldots B_0$ of the ADC circuit corresponding to latest conversion result from the SAR register 308. Signal P1 represents the control signal "P1" in FIG. 4, signal P2 represents the control signal "P2" in FIG. 4, and signal P3 represents the control signal "P3" in FIG. 4.

Figure 7:
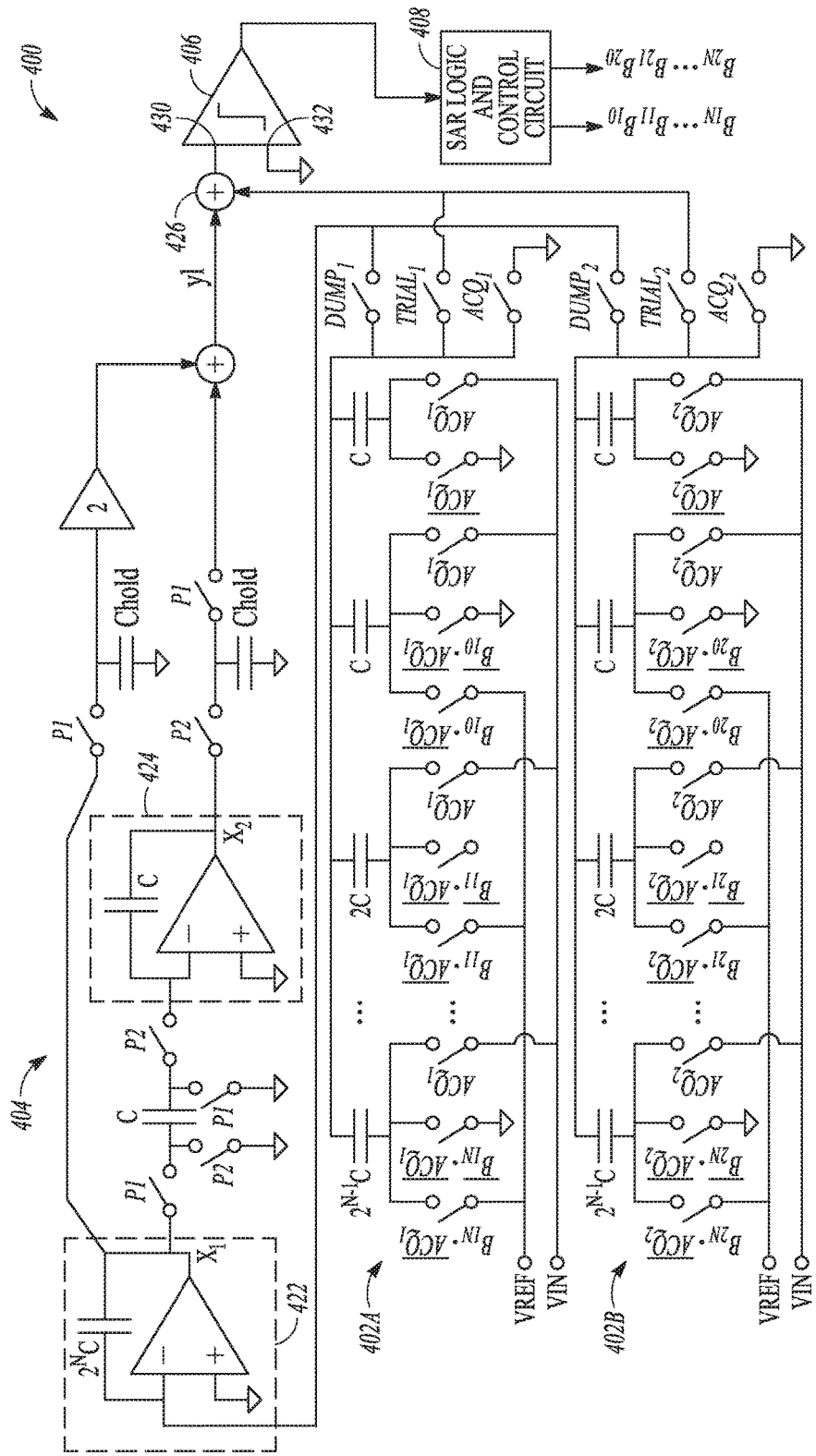
FIG. 7 illustrates another example of a noise-shaping ADC circuit including time-interleaved signal acquisition with a shared noise-shaping circuit, in accordance with this disclosure.

FIG. 7 illustrates another example of a noise-shaping ADC circuit 400 including time-interleaved signal acquisition with a shared noise-shaping circuit, in accordance with this disclosure. The noise-shaping SAR ADC circuit 400 can include a first DAC circuit 402A and a second DAC circuit 402B (referred to collectively as the "DAC circuits 402). The DAC circuits 402 can include capacitor DAC circuits, for example. Each of the DAC circuits 402A-402B can be similar to the DAC circuit 202 of FIG. 2 and, for purposes of conciseness, will not be described in detail again.

Like the ADC circuit 300 of FIG. 4, the ADC circuit 400 of FIG. 7 can include a noise-shaping circuit 404, e.g., a filter circuit, a comparator circuit 406, and a control circuit 408, e.g., a SAR logic circuit, coupled between the output of the comparator circuit 406 and the DAC circuits 402. As seen in FIG. 7, the noise-shaping circuit 404 is shared by the two DAC circuits 402 and is configured to receive a residue charge of the first DAC circuit 402A and a residue charge of the second DAC circuit 402B.

The noise-shaping circuit 404 can be a first order circuit or a higher order circuit. The noise-shaping circuit 404 of FIG. 7 is depicted as a second order circuit having a first integrator circuit 422 having output "x1" and a second integrator circuit 424 having output "x2". In some noise-shaping circuit configurations, it can be desirable to use a finite impulse response (FIR) circuit instead of an integrator circuit. To control the sampling and integration of the two DAC circuit 402 during two phases, the control circuit 408 can output control signals to control the various switches "p1" and "p2" shown in FIG. 7, and the noise-shaping circuit 404 can output a voltage "y1".

Shown conceptual by a summing circuit 426, the output "y1" of the noise-shaping circuit 404 can be combined with a charge contribution of a bit-trial of the bit-trial phases of the DAC circuits 402. The comparator circuit 406 can receive the combination at a first input 430 and can compare the combination at the first input to a voltage at a second input 432.

As seen in FIG. 7, the first DAC circuit 402A can be coupled via a first set of switches ACQ1, TRIAL1, and DUMP1 to ground, the summing circuit 426, and the noise-shaping circuit 404, respectively. The second DAC circuit 402B can be similarly coupled via a second set of switches ACQ2, TRIAL2, and DUMP2. The control circuit 408 can control operation of the switches to control the time-interleaving operation of the DAC circuits 402.

Figure 8:
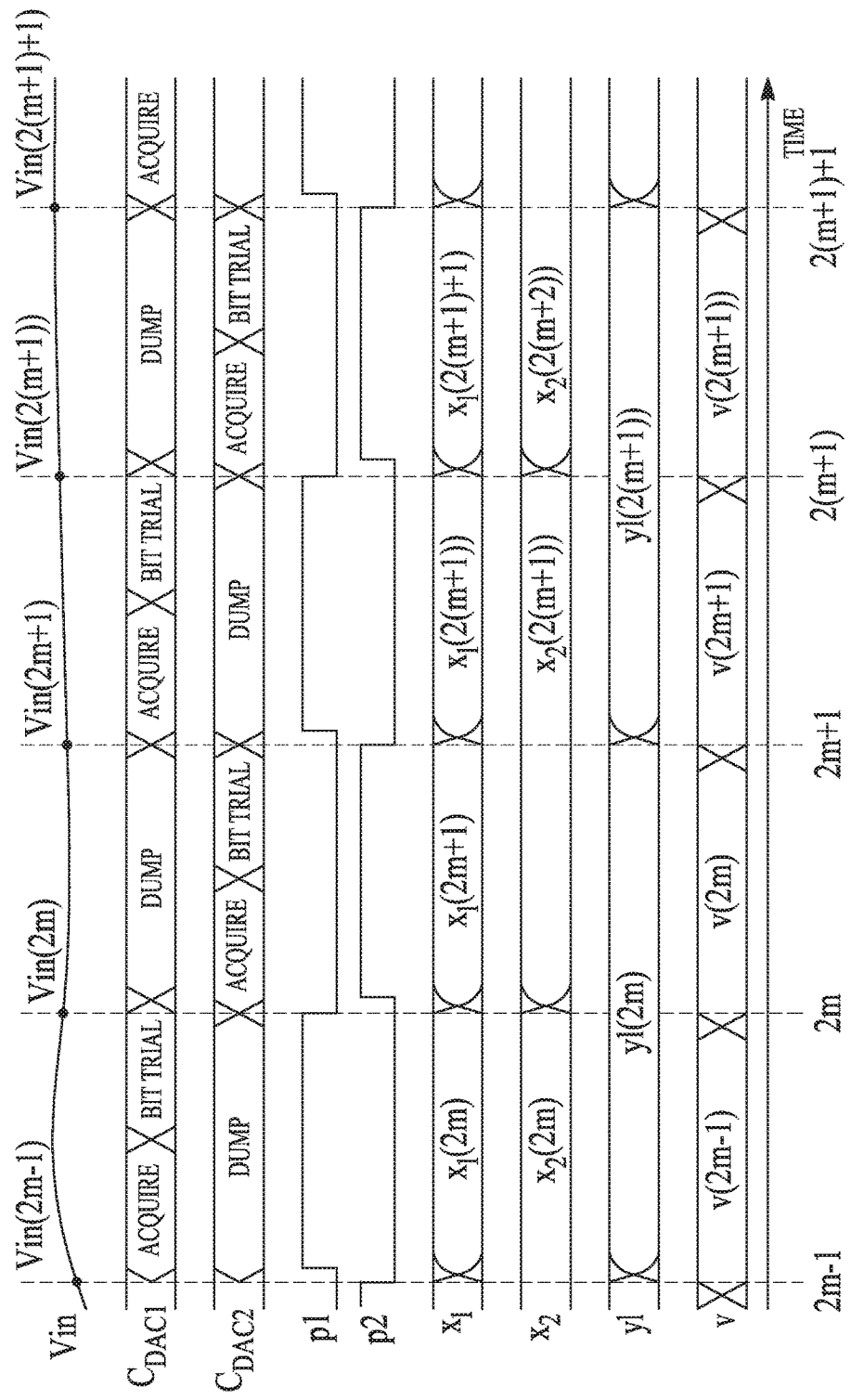
FIG. 8 depicts an example of a timing diagram for the noise-shaping SAR ADC of FIG. 7.

FIG. 8 depicts an example of a timing diagram for the noise-shaping SAR ADC of FIG. 7. The x-axis represents time, from 2m−1 to 2(m+1)+1, normalized to the clock period Ts. Signals "x1" and "x2" represent the output the first and second integrator circuits 422, 424, respectively, signal "y1" represents the output of the noise-shaping circuit 404, and signal "v" represents the reconstructed output $B_n \ldots B_0$ of the ADC circuit corresponding to latest conversion result from the SAR register 408. Signal $C_{DAC1}$ represents the DAC circuit 402A and signal $C_{DAC2}$ represents the DAC circuit 402B. Signal p1 represents the control signal for switches "p1" in FIG. 7 and signal p2 represents the control signal for switches "p2" in FIG. 7.

Initially, during the phase starting just after time 2m−1 and ending at time 2m, $C_{DAC1}$ is in an acquisition phase to receive a first sample of input signal Vin, $C_{DAC2}$ is in a residue charge transfer phase (transferring quantization error to the noise-shaping circuit 404) and is coupled to the noise-shaping circuit 404. While $C_{DAC2}$ is in the residue charge transfer phase, $C_{DAC1}$ moves into a bit-trial phase. During the phase starting just after time 2m and ending at time 2m−1, $C_{DAC1}$ is in a residue charge transfer phase and is coupled to the noise-shaping circuit 404 $C_{DAC2}$ is coupled to the noise-shaping circuit 404, and $C_{DAC2}$ is in an acquisition phase to receive a second sample of input signal Vin. While $C_{DAC1}$ is in the residue charge transfer phase, $C_{DAC2}$ moves into a bit-trial phase. Then the entire sequence is repeated. In this manner, the control circuit 408 can time-interleave acquisition, bit-trial, and residue charge transfer phases of the first and second DAC circuits.

Figure 9:
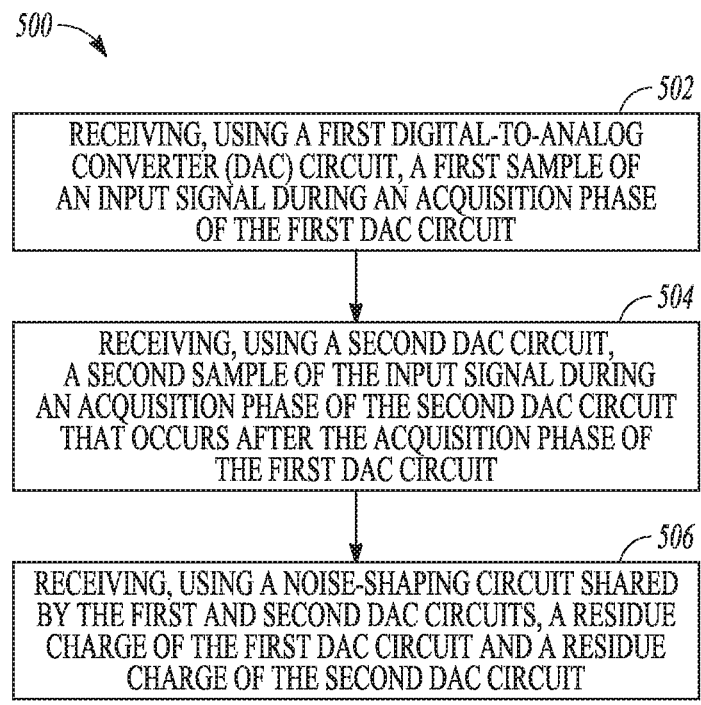
FIG. 9 depicts an example of a method of operating a noise-shaping successive approximation register analog-to-digital converter (ADC) circuit including time-interleaved signal acquisition with a shared noise-shaping circuit.

FIG. 9 depicts an example of a method 500 of operating a noise-shaping successive approximation register analog-to-digital converter (ADC) circuit including time-interleaved signal acquisition with a shared noise-shaping circuit. At block 502, the method 500 can include receiving, using a first digital-to-analog converter (DAC) circuit, a first sample of an input signal during an acquisition phase of the first DAC circuit. For example, the first DAC circuit 302A of FIG. 4 (or the first DAC circuit 402A of FIG. 7) can receive a first sample of input signal VIN during an acquisition phase of the first DAC circuit.

At block 504, the method 500 can include receiving, using a second DAC circuit, configured to receive a second sample of the input signal during an acquisition phase of the second DAC circuit that occurs after the acquisition phase of the first DAC circuit. For example, the second DAC circuit 302B of FIG. 4 (or the second DAC circuit 402B of FIG. 7) can receive a second sample of input signal VIN during an acquisition phase of the second DAC circuit that occurs after the acquisition phase of the first DAC circuit.

At block 506, the method 500 can include receiving, using a noise-shaping circuit shared by the first and second DAC circuits, a residue charge of the first DAC circuit and a residue charge of the second DAC circuit. For example, the noise-shaping circuit 304 of FIG. 4 (or the noise-shaping circuit 404 of FIG. 7) can receive a residue charge of the first DAC circuit 302A and a residue charge of the second DAC circuit 302B (or a residue charge of the first DAC circuit 402A and a residue charge of the second DAC circuit 402 of FIG. 7).

It should be noted that although the time-interleaving techniques have been described in this disclosure using two or three DAC circuits, more than three DAC circuits can be used. In addition, it should be noted that for purposes of simplicity, the figures have been drawn using singled-ended ADC configurations. However, the techniques of this disclosure can be applied to differential configurations. In a differential configuration, the two DAC circuits 402A, 402B (e.g., a first set of DAC circuits) and the noise-shaping circuit 404 of FIG. 7 can be duplicated and applied to the second input 432 of the comparator circuit 406 (instead of the second input 432 being grounded).

Similarly, in a differential configuration, the three DAC circuits 302A-302C (e.g., a first set of DAC circuits) and the noise-shaping circuit 304 of FIG. 4 can be duplicated and applied to the second input 332 of the comparator circuit 306 (instead of the second input 332 being grounded).

VARIOUS NOTES

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced.

These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A method of operating a noise-shaping successive approximation register analog-to-digital converter (ADC) circuit including time-interleaved signal acquisition with a shared noise-shaping circuit, the method comprising:
  receiving at a first rate, using a first digital-to-analog converter (DAC) circuit, a first sample of an input signal during an acquisition phase of the first DAC circuit;
  receiving at the first rate, using a second DAC circuit, a second sample of the input signal during an acquisition phase of the second DAC circuit that occurs after the acquisition phase of the first DAC circuit;
  combining a residue charge of the first DAC circuit and a residue charge of the second DAC circuit;
  updating the noise-shaping circuit at a second rate less than the first rate;
  generating an output using the combination of residue charge; and
  controlling a timing between the first and second DAC circuits and the noise-shaping circuit to time-interleave acquisition, bit-trial, and residue charge transfer phases of the first and second DAC circuits.

2. The method of claim 1, comprising:
  receiving the residue charge of the first DAC circuit after a bit-trial phase of the first DAC circuit; and
  receiving the residue charge of the second DAC circuit after a bit-trial phase of the second DAC circuit.

3. The method of claim 1, comprising:
  sharing the noise-shaping circuit between the first and second DAC circuits.

4. The method of claim 1, wherein controlling a timing between the first and second DAC circuits to time-interleave acquisition, bit-trial, and residue charge transfer phases of the first and second DAC circuits includes:

controlling a first plurality of switches such that the first DAC circuit receives a first sample of an input signal during an acquisition phase of the first DAC circuit; and controlling a second plurality of switches such that the second DAC circuit receives a second sample of the input signal during an acquisition phase of the second DAC circuit that occurs after the acquisition phase of the first DAC circuit.

5. The method of claim 1, further comprising:

receiving at the first rate, using a third DAC circuit, a third sample of the input signal during an acquisition phase of the third DAC circuit that occurs after the acquisition phases of the first and second DAC circuits; and wherein controlling a timing between the first and second DAC circuits to time-interleave acquisition, bit-trial, and residue charge transfer phases of the first and second DAC circuits includes:

controlling a timing between the first, second, and third DAC circuits to time-interleave acquisition, bit-trial, and residue charge transfer phases of the first, second, and third DAC circuits.

6. The method of claim 5, comprising:

receiving the residue charge of the first DAC circuit after a bit-trial phase of the first DAC circuit;

receiving the residue charge of the second DAC circuit after a bit-trial phase of the second DAC circuit;

receiving the residue charge of the third DAC circuit after a bit-trial phase of the third DAC circuit; and combining the residue charge of the third DAC circuit with the residue charges of the first and second DAC circuits.

7. The method of claim 5, wherein controlling a timing between the first, second, and third DAC circuits to time-interleave acquisition, bit-trial, and residue charge transfer phases of the first, second, and third DAC circuits is such that:

the time-interleaving includes the first DAC circuit performing a bit-trial on the first sample of the input signal during the acquisition phase of the second DAC circuit that occurs during a residue charge transfer phase of the third DAC circuit.

8. A noise-shaping successive approximation register (SAR) analog-to-digital converter (ADC) circuit including time-interleaved signal acquisition with a shared noise-shaping circuit, the ADC circuit comprising:

a first digital-to-analog converter (DAC) circuit configured to receive, at a first rate, a first sample of an input signal during an acquisition phase of the first DAC circuit;

a second DAC circuit configured to receive, at the first rate, a second sample of the input signal during an acquisition phase of the second DAC circuit that occurs after the acquisition phase of the first DAC circuit;

a control circuit configured to:

control a timing between the first and second DAC circuits and the noise-shaping circuit to time-interleave acquisition, bit-trial, and residue charge transfer phases of the first and second DAC circuits; and update the noise-shaping circuit at a second rate less than the first rate; and the noise-shaping circuit configured to:

combine a residue charge of the first DAC circuit and a residue charge of the second DAC circuit; and generate an output using the combination of residue charge.

9. The noise-shaping ADC circuit of claim 8, wherein the noise-shaping circuit is configured to:

receive the residue charge of the first DAC circuit after a bit-trial phase of the first DAC circuit; and receive the residue charge of the second DAC circuit after a bit-trial phase of the second DAC circuit.

10. The noise-shaping ADC circuit of claim 8, wherein the noise-shaping circuit is shared by the first and second DAC circuits.

11. The noise-shaping ADC circuit of claim 8, wherein the first DAC circuit includes a first plurality of switches;

wherein the second DAC circuit includes a second plurality of switches; and wherein the control circuit configured to control a timing between the first and second DAC circuits to time-interleave acquisition, bit-trial, and residue charge transfer phases of the first and second DAC circuits is configured to:

control the first plurality of switches such that the first DAC circuit receives a first sample of an input signal during an acquisition phase of the first DAC circuit; and control the second plurality of switches such that the second DAC circuit receives a second sample of the input signal during an acquisition phase of the second DAC circuit that occurs after the acquisition phase of the first DAC circuit.

12. The noise-shaping ADC circuit of claim 8, further comprising:

a third DAC circuit configured to receive, at the first rate, a third sample of the input signal during an acquisition phase of the third DAC circuit, wherein the control circuit configured to control a timing between the first and second DAC circuits to time-interleave acquisition, bit-trial, and residue charge transfer phases of the first and second DAC circuits is configured to:

control a timing between the first, second, and third DAC circuits to time-interleave acquisition, bit-trial, and residue charge transfer phases of the first, second, and third DAC circuits.

13. The noise-shaping ADC circuit of claim 12, wherein the noise-shaping circuit is configured to:

receive the residue charge of the first DAC circuit after a bit-trial phase of the first DAC circuit;

receive the residue charge of the second DAC circuit after a bit-trial phase of the second DAC circuit;

receive the residue charge of the third DAC circuit after a bit-trial phase of the third DAC circuit; and combine the residue charge of the third DAC circuit with the residue charges of the first and second DAC circuits.

14. The noise-shaping ADC circuit of claim 13, wherein the noise-shaping circuit is shared by the first, second, and third DAC circuits.

15. The noise-shaping ADC circuit of claim 8, wherein the noise-shaping circuit includes at least one integrator circuit.

16. The noise-shaping ADC circuit of claim 8, wherein the control circuit configured to control a timing between the first and second DAC circuits to time-interleave acquisition, bit-trial, and residue charge transfer phases of the first and second DAC circuits is further configured such that:

the time-interleaving includes the first DAC circuit configured to perform a bit-trial on a first sample of an input signal during an acquisition phase of the second DAC circuit that occurs during a residue charge transfer phase of a third DAC circuit.

17. The noise-shaping ADC circuit of claim 8, wherein the first and second DAC circuits form a first DAC circuit set, the noise-shaping SAR ADC circuit further comprising:
a second DAC circuit set, wherein the first and second DAC circuit sets are arranged in a differential configuration.

18. A noise-shaping successive approximation register (SAR) analog-to-digital converter (ADC) circuit including time-interleaved signal acquisition with a shared noise-shaping circuit, the ADC circuit comprising:
means for receiving at a first rate a first sample of an input signal during an acquisition phase of a first digital-to-analog converter (DAC) circuit;
means for receiving at the first rate a second sample of the input signal during an acquisition phase of a second DAC circuit that occurs after the acquisition phase of the first DAC circuit;
means for combining a residue charge of the first DAC circuit and a residue charge of the second DAC circuit;
means for updating the noise-shaping circuit at a second rate less than the first rate;
means for generating an output using the combination of residue charge; and
means for controlling a timing between the first and second DAC circuits and the noise-shaping circuit to time-interleave acquisition, bit-trial, and residue charge transfer phases of the first and second DAC circuits.

19. The noise-shaping ADC circuit of claim 18, comprising:
means for receiving the residue charge of the first DAC circuit after a bit-trial phase of the first DAC circuit; and
means for receiving the residue charge of the second DAC circuit after a bit-trial phase of the second DAC circuit.

20. The noise-shaping ADC circuit of claim 18, further comprising:
means for receiving a third sample of the input signal during an acquisition phase of a third DAC circuit that occurs after the acquisition phase of the second DAC circuit;
means for receiving at the first rate a residue charge of the first DAC circuit after a bit-trial phase of the first DAC circuit;
means for receiving the residue charge of the second DAC circuit after a bit-trial phase of the second DAC circuit;
means for receiving the residue charge of the third DAC circuit after a bit-trial phase of the third DAC circuit; and
means for combining the residue charges of the first, second, and third DAC circuits.

* * * * *